United States Patent
Miyazaki (10) Patent No.: US 8,614,598 B2
(45) Date of Patent: Dec. 24, 2013

(54) OUTPUT CIRCUIT, SYSTEM INCLUDING OUTPUT CIRCUIT, AND METHOD OF CONTROLLING OUTPUT CIRCUIT

(75) Inventor: Hiroshi Miyazaki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 59 days.

(21) Appl. No.: 13/357,469

(22) Filed: Jan. 24, 2012

(65) Prior Publication Data

US 2012/0206179 A1    Aug. 16, 2012

(30) Foreign Application Priority Data

Feb. 14, 2011  (JP) ................................. 2011-028879

(51) Int. Cl.
*H03K 5/08*    (2006.01)
(52) U.S. Cl.
USPC ........... 327/309; 327/108; 327/313; 327/321; 361/15; 361/91.1
(58) Field of Classification Search
USPC ......... 327/108–112, 309, 313, 318, 319, 321, 327/324, 327, 328; 361/15, 18, 91.1, 111
See application file for complete search history.

(56) References Cited

U.S. PATENT DOCUMENTS

| 3,937,983 | A | | 2/1976 | Reed | |
|---|---|---|---|---|---|
| 5,345,357 | A | * | 9/1994 | Pianka | ............................. 361/56 |
| 6,737,905 | B1 | * | 5/2004 | Noda et al. | .................... 327/323 |
| 6,947,335 | B2 | | 9/2005 | Nakamura | |
| 7,456,649 | B2 | | 11/2008 | Miyazaki | |

FOREIGN PATENT DOCUMENTS

| GB | 2305035 A | 3/1997 |
|---|---|---|
| JP | 2003-124798 A | 4/2003 |
| JP | 2009-531934 A | 9/2009 |
| WO | WO-2007/113765 A1 | 10/2007 |

OTHER PUBLICATIONS

Extended European Search Report dated Mar. 22, 2013 for corresponding to European Application No. 12151674.4.

* cited by examiner

*Primary Examiner* — Ann Luu (74) *Attorney, Agent, or Firm* — Fujitsu Patent Center

(57) ABSTRACT

An output circuit includes a first transistor coupled to an external terminal and having a gate terminal that receives a first drive signal. The first transistor pulls down a potential at the external terminal when activated in accordance with the first drive signal. The output circuit also includes a capacitor. The capacitor includes a first end coupled to the gate terminal of the first transistor. A clamp circuit, coupled to a second end of the capacitor, clamps the second end of the capacitor to a potential corresponding to the operation of the first transistor. The first transistor includes a drain terminal that is not coupled to the capacitor but is coupled to the external terminal.

11 Claims, 4 Drawing Sheets

OUTPUT CIRCUIT, SYSTEM INCLUDING OUTPUT CIRCUIT, AND METHOD OF CONTROLLING OUTPUT CIRCUIT

CROSS-REFERENCE TO RELATED APPLICATIONS

This application is based upon and claims the benefit of priority from prior Japanese Patent Application No. 2011-028879, filed on Feb. 14, 2011, the entire contents of which are incorporated herein by reference.

FIELD

The present application relates to an output circuit, a system including the output circuit, and a method of controlling the output circuit.

BACKGROUND

Communication among a plurality of devices is, for example, conventionally carried out by serial communication. Such devices include an open-drain type output circuit (see Japanese Patent Publication No. 2009-531934).

Figure 1:
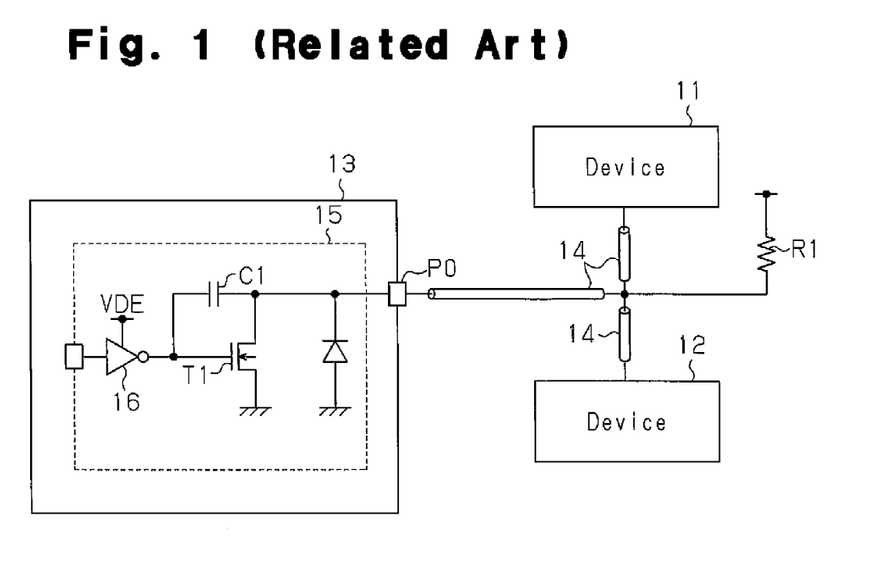
FIG. 1 is a schematic circuit block diagram of a system including an output circuit.

As illustrated in FIG. 1, a plurality of devices 11, 12, and 13 is mutually coupled by a transmission path 14 which transmits and receives data. The device 13 includes an output circuit 15 which outputs data. Although not illustrated, other devices 11 and 12 also include a similar output circuit.

Figure 2A:
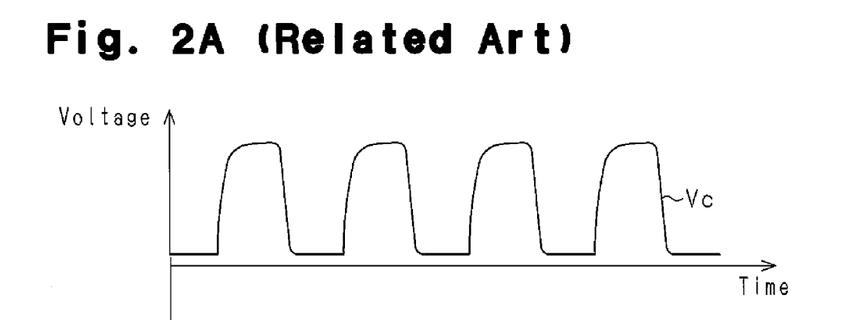
FIGS. 2A and 2B are waveform charts illustrating change in potential level of a transmission path between devices.

The output circuit 15 is an open drain type driver circuit. A resistor R1 pulls up a potential level of the transmission path 14. The device 13 activates an N-channel MOS transistor T1, which is coupled to an external terminal P0, to pull down the potential level of the transmission path 14, which is coupled to the external terminal P0. Thus, the voltage Vc of the signal propagated through the transmission path 14 is changed, as illustrated in FIG. 2A.

In this manner, the output circuit 15 activates the N-channel MOS transistor T1 to change the potential of the transmission path 14 from H level to L level. A waveform shaping capacitor C1 may be coupled between a gate and a drain of the transistor T1 to adjust the slope of the falling edge of the potential level in the transmission path 14.

Figure 2B:
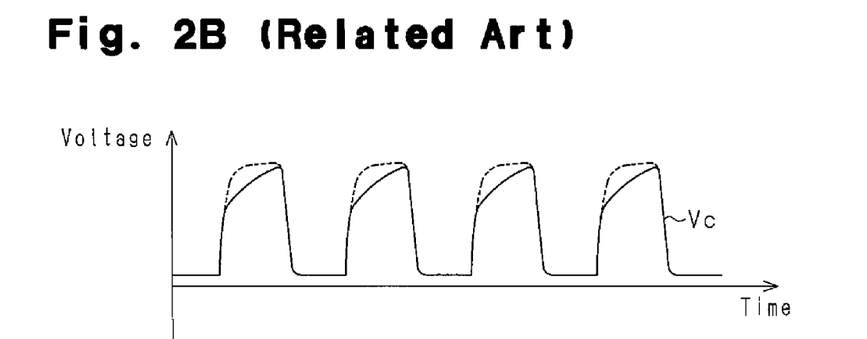

In the above system, when the communication is performed between the two devices 11 and 12, the power supply of the device 13 that does not perform the communication may be turned off. When the power supply of the device 13 is turned off, the supply of high potential voltage VDE to an inverter circuit 16, for example, is stopped. In this case, a gate terminal of the transistor T1 is in a floating state. Furthermore, when the high potential voltage VDE is fixed to a ground potential (0V), the gate terminal of the transistor T1 is held at L level. Thus, when the power supply of the device 13 is turned OFF or the power supply voltage is fixed at the ground potential, the gate terminal of the transistor T1 of the output circuit 15 is AC coupled with the transmission path 14 through the waveform shaping capacitor C1. Therefore, when the potential of the transmission path 14 changes from L level to H level, the gate voltage of the transistor T1 also rises. The transistor T1 is then weakly activated. As a result, as illustrated in FIG. 2B, the waveform of the voltage Vc in the transmission path 14 changes from a waveform indicated by the dotted line to a waveform indicated by the solid line. That is, the transistor T1 of the device 13 illustrated in FIG. 1 draws in minimal current from the transmission path 14, so that the waveform shape of the signal communicated through the transmission path 14 between the device 11 and the device 12 changes undesirably.

SUMMARY

According to one aspect, an output circuit includes a first transistor coupled to an external terminal. The first transistor includes a gate terminal that receives a first drive signal, and drives a potential at the external terminal in accordance with the first drive signal. The output circuit further includes a capacitor. The capacitor includes a first end coupled to the gate terminal of the first transistor. A clamp circuit clamps a second end of the capacitor to a potential corresponding to the operation of the first transistor.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

The embodiments of an output circuit, a system including the output circuit, and a method of controlling the output circuit will be described according to the accompanying drawings.

[System Configuration]

Figure 3:
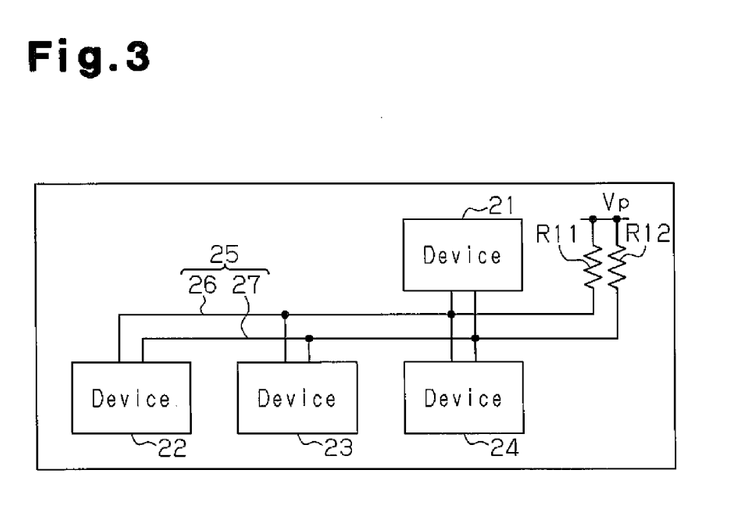
FIG. 3 is a schematic circuit block diagram of a system including an output circuit.

As illustrated in FIG. 3, an electronic system includes a plurality of (four in FIG. 3) of devices 21, 22, 23, and 24. The devices 21 to 24 are coupled to each other by a bus 25.

The devices 21 to 24 are formed to transmit and receive signals and data with each other through the bus 25 in accordance with a given synchronous serial communication. The synchronous serial communication is, for example, an Inter Integrated Circuit communication. In the case of such a communication method, the bus 25 includes, for example, a first transmission path 26, which transmits a clock signal, and a second transmission path 27, which transmits data. For example, each of the transmission paths 26 and 27 is a cable or a pattern wiring formed on a substrate.

A resistor R11 is arranged on the first transmission path 26. The resistor R11 includes a first terminal coupled to the first transmission path 26 and a second terminal supplied with a voltage Vp. Thus, the resistor R11 pulls up a potential level in the first transmission path 26. A resistor R12 is arranged on the second transmission path 27. The resistor R12 includes a first terminal coupled to the second transmission path 27 and a second terminal supplied with the voltage Vp. Thus, the resistor R12 pulls up a potential level in the second transmission path 27.

At least one of the devices 21 to 24 is formed to operate as a master device. For example, the master device is a microcontroller that generates a clock signal for data transfer and outputs the clock signal to the first transmission path 26. The master device starts and terminates the data transfer on the bus. The device whose address is instructed by the master device is called a slave device. For example, the device 21 is the master device, and the devices 22 to 24 are the slave devices.

[Example of Device Structure]

Figure 4:
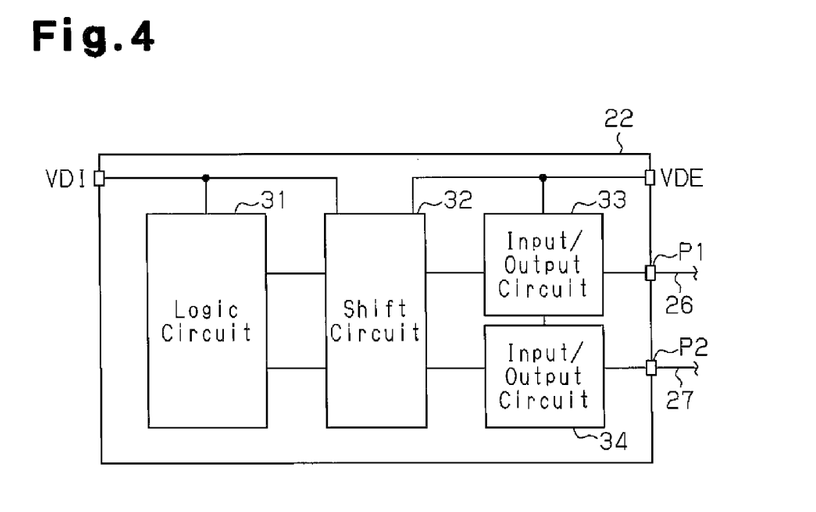
FIG. 4 is a schematic block diagram of a device.

As illustrated in FIG. 4, the device 22 includes a logic circuit 31 that operates by a first high potential voltage VDI. The logic circuit 31 is coupled to an input/output circuit 33 that operates by a second high potential voltage VDE through a shift circuit 32. The shift circuit 32 shifts a level of the signal, which is output from the logic circuit 31, to a level of the signal, which is handled by the input/output circuits 33 and 34. Further, the shift circuit 32 shifts a level of the signal, which is output from the input/output circuits 33 and 34, to a level of the signal, which is handled by the logic circuit 31.

The logic circuit 31 has a data processing function and a communication control function. The input/output circuit 33 pulls down a potential level in the transmission path 26 coupled to an external terminal P1 based on a signal provided from the logic circuit 31 through the shift circuit 32. The input/output circuit 33 outputs a signal based on the change in the potential level of the transmission path 26 to the shift circuit 32. The input/output circuit 34 pulls down a potential level in the transmission path 27 coupled to an external terminal P2 based on a signal provided from the logic circuit 31 through the shift circuit 32. The input/output circuit 34 outputs a signal based on the change in the potential level of the transmission path 27 to the shift circuit 32.

[Example of Input/Output Circuit Structure]

Figure 5:
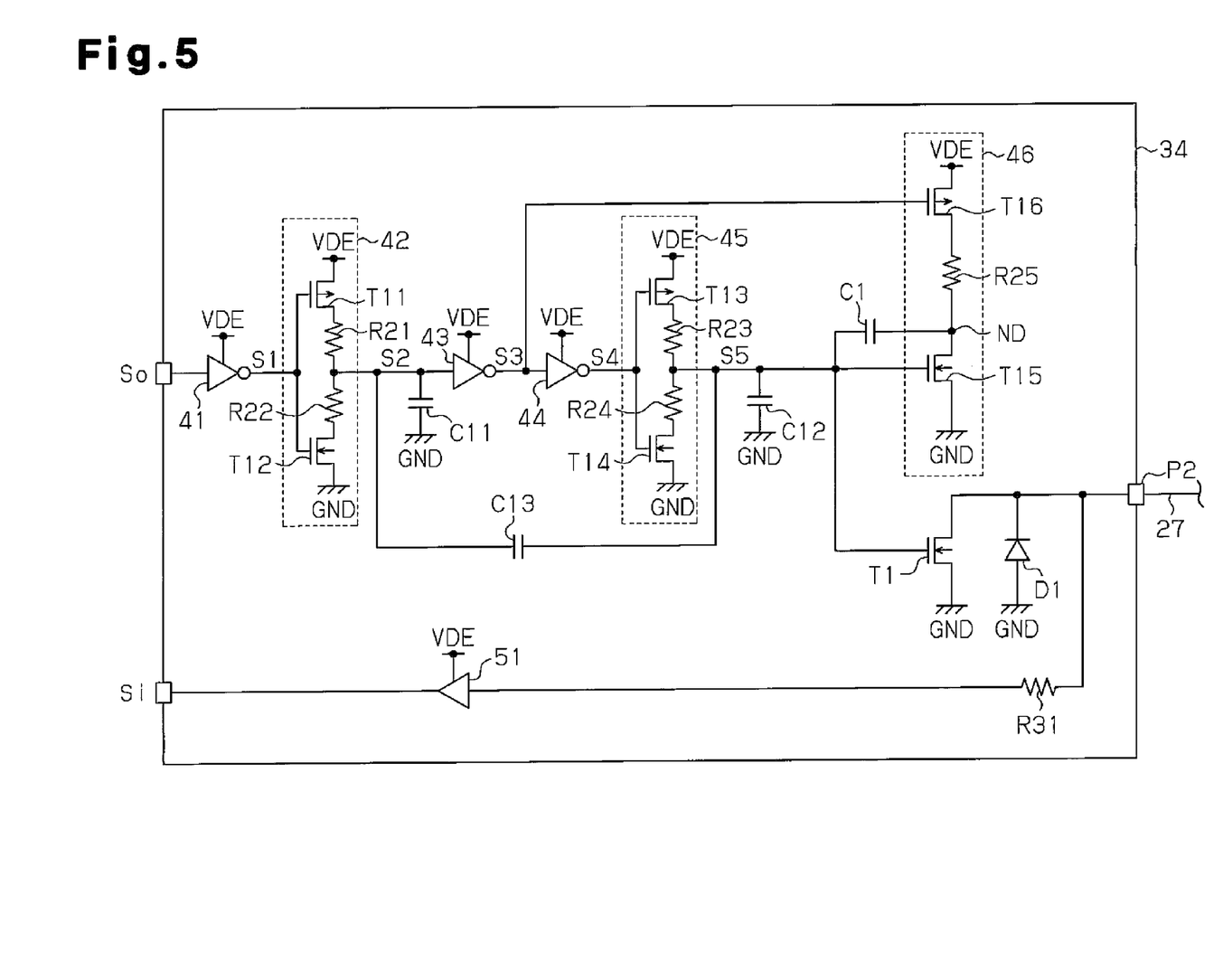
FIG. 5 is a schematic circuit diagram of an input/output circuit of one embodiment.

As illustrated in FIG. 5, the input/output circuit 34 includes an inverter circuit 41. A signal So is provided to the inverter circuit 41 based on a signal output from the shift circuit 32 illustrated in FIG. 4. The inverter circuit 41 operates by the high potential voltage VDE supplied as a drive voltage and logically inverts the signal So to generate a signal 51. The signal 51 is provided to an inverter circuit 42.

The inverter circuit 42 includes a P-channel MOS transistor T11, an N-channel MOS transistor T12, and resistors R21 and R22. The signal 51 is provided to gate terminals of the transistors T11 and T12. A source terminal of the transistor T11 is coupled to a wiring supplied with the high potential voltage VDE. A drain terminal of the transistor T11 is coupled to a first terminal of the resistor R21. A second terminal of the resistor R21 is coupled to a first terminal of the resistor R22. A second terminal of the resistor R22 is coupled to a drain terminal of the transistor T12. A source terminal of the transistor T12 is coupled to a wiring supplied with a low potential voltage (e.g., ground potential). This wiring will be hereinafter described as ground GND. An output node between the resistor R21 and the resistor R22 is coupled to a first terminal of a capacitor C11. A second terminal of the capacitor C11 is coupled to the ground GND.

The inverter circuit 42 logically inverts the signal S1 to generate a signal S2 and outputs the signal S2 from the output node between the resistor R21 and the resistor R22. The signal S2 is provided to an inverter circuit 43. The transistors T11 and T12 are activated and inactivated in a complementary manner in response to the signal S1. The resistor R21 limits the amount of current flowing towards the output node from the wiring of the high potential voltage VDE through the transistor T11 that has been activated. This limitation in the amount of current suppresses the amount of change per unit time of the current for charging the load capacity at the node coupled to the first terminal of the capacitor C11 at the time of ON switching of the transistor T11. Therefore, the signal S2 rises from L level to H level based on a time constant corresponding to a resistance value of the resistor R21 and a capacitance value of the capacitor C11.

The resistor R22 limits the amount of current flowing towards the ground GND from the output node of the inverter circuit 42 through the transistor T12 that has been activated. This limitation in the amount of current suppresses the amount of change per unit time of the current for discharging the load capacity at the node coupled to the first terminal of the capacitor C11 at the time of ON switching of the transistor T12. Therefore, the signal S2 falls from H level to L level based on a time constant corresponding to a resistance value of the resistor R22 and the capacitance value of the capacitor C11.

The inverter circuit 43 operates by the high potential voltage VDE supplied as a drive voltage and logically inverts the signal S2 to generate a signal S3. The signal S3 is provided to an inverter circuit 44. The inverter circuit 44 operates by the high potential voltage VDE supplied as a drive voltage and logically inverts the signal S3 to generate a signal S4. The signal S4 is provided to an inverter circuit 45.

The inverter circuit 45 includes a P-channel MOS transistor T13, an N-channel MOS transistor T14, and resistors R23 and R24. The signal S4 is provided to gate terminals of the transistors T13 and T14. A source terminal of the transistor T13 is coupled to a wiring supplied with the high potential voltage VDE. A drain terminal of the transistor T13 is coupled to a first terminal of the resistor R23. A second terminal of the resistor R23 is coupled to a first terminal of the resistor R24. A second terminal of the resistor R24 is coupled to a drain terminal of the transistor T14. A source terminal of the transistor T14 is coupled to the ground GND. An output node between the resistor R23 and the resistor R24 is coupled to a first terminal of a capacitor C12. A second terminal of the capacitor C12 is coupled to the ground GND.

The inverter circuit 45 logically inverts the signal S4 to generate a signal S5 and outputs the signal S5 from the output node between the resistor R23 and the resistor R24. The transistors T13 and T14 are activated and inactivated in a complementary manner in response to the signal S4. The resistor R23 limits the amount of current flowing towards the output node of the inverter circuit 45 from the wiring of the high potential voltage VDE through the transistor T13 that has been activated. This limitation in the amount of current suppresses the amount of change per unit time of the current for charging the load capacity at the node coupled to the first terminal of the capacitor C12 at the time of ON switching of the transistor T13. Therefore, the signal S5 rises from L level to H level based on a time constant corresponding to a resistance value of the resistor R23 and a capacitance value of the capacitor C12.

The resistor R24 limits the amount of current flowing towards the ground GND from the output node of the inverter circuit 45 through the transistor T14 that has been activated.

This limitation in the amount of current suppresses the amount of change per unit time of the current for discharging the load capacity at the node coupled to the first terminal of the capacitor C12 at the time of ON switching of the transistor T14. Therefore, the signal S5 falls from H level to L level based on a time constant corresponding to a resistance value of the resistor R24 and the capacitance value of the capacitor C12.

The output node of the inverter circuit 45 is coupled to a first terminal of a capacitor C13. A second terminal of the capacitor C13 is coupled to the output node of the inverter circuit 42. The capacitor C13 AC-couples the output node of the inverter circuit 45 and the output node of the inverter circuit 42. A circuit that generates the signal S5, that is, in this example, a circuit including the inverter circuits 41 to 45 and the capacitors C11 to C13 is an example of a drive circuit. The structure of the drive circuit is not limited to the structure illustrated in FIG. 3.

The output node of the inverter circuit 45 is coupled to a transistor T1. The transistor T1, which is an N-channel MOS transistor, includes a gate terminal coupled to the output node of the inverter circuit 45, a source terminal coupled to the ground GND, and a drain terminal coupled to the external terminal P2. The external terminal P2 is coupled to a cathode of a diode D1. An anode of the diode D1 is coupled to the ground GND. The diode D1 is arranged as a protective element from en electrostatic discharge (ESD).

The transistor T1 is activated and inactivated in response to the signal S5. The transistor T1 that has been activated couples the external terminal P2 to the ground GND and pulls down the potential level of the transmission path 27. The transistor T1 that has been inactivated causes the external terminal P2 to be in a floating (high impedance) state. In this case, the potential level of the transmission path 27 is pulled up by the resistor R12 illustrated in FIG. 3.

The output node of the inverter circuit 45 is also coupled to a first terminal of a waveform shaping capacitor C1. A second terminal of the capacitor C1 is coupled to a clamp circuit 46 (output waveform slope control circuit). The capacitor C1 has a capacitance value that is set such that the slope of the fall (Fall-rate) of the potential level of the transmission path 27 conforms to the provision of the communication interface (IF).

The clamp circuit 46 includes transistors T15 and T16, and a resistor R25. The transistor T15 is the same conductivity type as the transistor T1 that pulls down the potential level of the transmission path 27, that is, an N-channel MOS transistor. The transistor T15 has electrical characteristics similar to the pull-down transistor T1.

A source terminal of the transistor T15 is coupled to the ground GND. A gate terminal of the transistor T15 is coupled to the output node of the inverter circuit 45. Therefore, the transistor T15 is activated and inactivated in response to the signal S5 output from the inverter circuit 45.

The second terminal of the capacitor C1 is coupled to the drain terminal of the transistor T15. That is, the waveform shaping capacitor C1 is coupled between the drain and the gate of the transistor T15.

The drain terminal of the transistor T15 is also coupled to a first terminal of the resistor R25. A second terminal of the resistor R25 is coupled to the transistor T16. For example, the transistor T16 is a P-channel MOS transistor. A source terminal of the transistor T16 is coupled to the wiring supplied with the high potential voltage VDE. A drain terminal of the transistor T16 is coupled to the second terminal of the resistor R25. A gate terminal of the transistor T16 is coupled to the output terminal of the inverter circuit 43.

The transistor T16 is activated and inactivated in response to the signal S3 provided to the gate terminal thereof. The transistor T16 that has been activated supplies the high potential voltage VDE to the second terminal of the resistor R25. Therefore, when the transistor T16 is activated, the resistor R25 pulls up the potential at a node ND between the resistor R25 and the transistor 15. The resistor R25 has a resistance value that is set according to the resistance value of the resistor R12 (see FIG. 3) adapted to pull up the potential level of the transmission path 27. For example, the resistance value of the resistor R25 may be equal to the resistance value of the resistor R12. The characteristic values of the transistor and the resistor arranged in the clamp circuit 46 may be set to arbitrary values as long as they are within a range in which the waveform shaping effect satisfies the communication interface provision.

As described above, the signal S3 provided to the gate terminal of the transistor T16 is provided to the inverter circuit 44, and the output signal S4 of the inverter circuit 44 is provided to the inverter circuit 45. Therefore, the output signal S5 of the inverter circuit 45 changes in phase with the output signal S3 of the inverter circuit 43. The transistor T15 and the transistor T16 have a conductivity type different from each other. Therefore, the transistor T15 and the transistor T16 are activated and inactivated in a substantially complementary manner. In the present example, the timing of activation and inactivation of the transistor T15 is later than the timing of activation and inactivation of the transistor T16 by the gate delay of the inverter circuits 44 and 45.

When the transistor T15 is inactivated, the transistor T16 is activated to pull up the potential of the node ND. When the transistor T16 is inactivated, the transistor T15 is activated to pull down the potential of the node ND.

The external terminal P2 is coupled to a first terminal of a resistor R31. A second terminal of the resistor R31 is coupled to an input terminal of a buffer circuit 51. The buffer circuit 51 is, for example, a Schmidt trigger gate. The buffer circuit 51 operates by the high potential voltage VDE supplied as a drive voltage. An output signal Si of the buffer circuit 51 is provided to the logic circuit 31 through the shift circuit 32 illustrated in FIG. 4.

Although FIG. 5 illustrates the input/output circuit 34 for driving the transmission path 27, the input/output circuit for driving the transmission path 26 illustrated in FIG. 3 is also similarly formed.

[Outline of Operation of Device]

The operation of the input/output circuit 34 formed as above will now be described.

[When High Potential Voltage VDE is Supplied to Input/Output Circuit 34]

When the signal So is H level, the inverter circuit 45 provides the signal S5 of L level to the gate terminal of the transistor T1. Therefore, the transistor T1 is inactivated in response to the signal S5 of L level. The potential level of the transmission path 27 is thus pulled up by the resistor R12 illustrated in FIG. 3. That is, the potential of the transmission path 27 becomes H level.

When the signal So falls from H level to L level, the inverter circuit 43 outputs the signal S3 that changes from L level to H level. The transistor T16 of the clamp circuit 46 switches from an activated state to an inactivated state in response to the signal S3 that has been changed from L level to H level.

The inverter circuit 44, which receives the signal S3 output from the inverter circuit 43, outputs the signal S4 that changes from H level to L level in response to the signal S3 that has been changed from L level to H level. Therefore, the inverter circuit 45 raises the gate voltage of the transistor T1 from L level to H level in response to the signal S4 that has been changed from H level to L level. In this case, the signal S5 provided to the gate terminal of the transistor T1 is gradually raised based on the time constant corresponding to the resistance value of the resistor R23 and the capacitance value of the capacitor C12 so as to gradually raise the gate voltage of the transistor T1. The coupling effect by the capacitor C13 coupled between the output node of the inverter circuit 42 and the output node of the inverter circuit 45 also contributes to the transition characteristic of the signal S5 provided to the gate terminal of the transistor T1.

The transistor T1 is activated when the voltage of the signal S5, that is, the gate voltage of the transistor T1 reaches a threshold value voltage thereof. The drain current of the transistor T1 gradually increases according to the rise in the gate voltage of the transistor T1, thus gradually pulling down the potential level of the transmission path 27 to L level.

When the signal S3 is L level, the node ND of the clamp circuit 46 is pulled up to the level of the high potential voltage VDE by the transistor T16 that has been activated and the resistor R25. When the signal S3 changes from L level to H level to thus inactivate the transistor T16, the signal S5 switches the transistor T15 from the inactivated state to the activated state to gradually lower the potential of the node ND to L level.

In other words, the clamp circuit 46 pulls down the potential level of the node ND similar to the potential level of the transmission path 27. At this time, the waveform shaping capacitor C1, which is coupled between the node ND and the gate terminal of the transistor T15, AC-couples the node ND and the gate terminal of the transistor T15. The gate terminal of the transistor T15 is coupled to the gate terminal of the pull-down transistor T1. Therefore, the potential level of the gate terminal of the transistor T1 gradually rises to H level due to the influence of the AC coupling by the capacitor C1.

When the signal So rises from L level to H level, the inverter circuit 43 outputs the signal S3 that changes from H level to L level. The transistor T16 of the clamp circuit 46 changes from the inactivated state to the activated state in response to the signal S3 that has been changed from H level to L level. In this case, the output signal S5 of the inverter circuit 45 changes from H level to L level. The transistor T1 changes from the activated state to the inactivated state in response to the signal S5, and the transmission path 27 changes to the floating (high impedance) state from the state of being pulled down to L level. In this case, the potential of the transmission path 27 is pulled up to H level by the resistor R12 illustrated in FIG. 3. The output signal S5 of the inverter circuit 45 is provided to the clamp circuit 46. Therefore, the clamp circuit 46 pulls up the potential of the node ND to H level similar to the potential level of the transmission path 27.

[When High Potential Voltage VDE is not Supplied to Input/Output Circuit 34]

A case in which the high potential voltage VDE is not supplied assumes a state at the time of power (power consumption) management in the bus interface system, that is, a low power consumption state. For example, in the device 22 including the input/output circuit 34, the power supply of the device 22 is turned OFF when the operation stopped state of the input/output circuit 34 on the system bus is anticipated. In this case, the external terminal P2 is in the floating state.

At this time, other devices (e.g., devices 21, 23, and 24 illustrated in FIG. 3), which are coupled to the transmission path 27, are in an activation state and may perform communication with each other. In this case, the change in signal communicated between the other devices (e.g., between device 21 and device 23) is transmitted to the external terminal P2 illustrated in FIG. 5 through the transmission path 27.

Here, as illustrated in FIG. 5, the waveform shaping capacitor C1 is coupled between the drain and the gate of the transistor T15 of the clamp circuit 46, and is not coupled between the drain and the gate of the pull down transistor T1. Therefore, the AC-coupling does not act on the pull-down transistor as in the conventional circuit even if the potential level of the external terminal P2 changes. Thus, the state of the gate node of the transistor T1 does not change. Therefore, the external terminal P2, to which the input/output circuit 34 of the device 22 is coupled, is in a stable floating state even if the high potential voltage VDE is turned OFF.

Figure 6A:
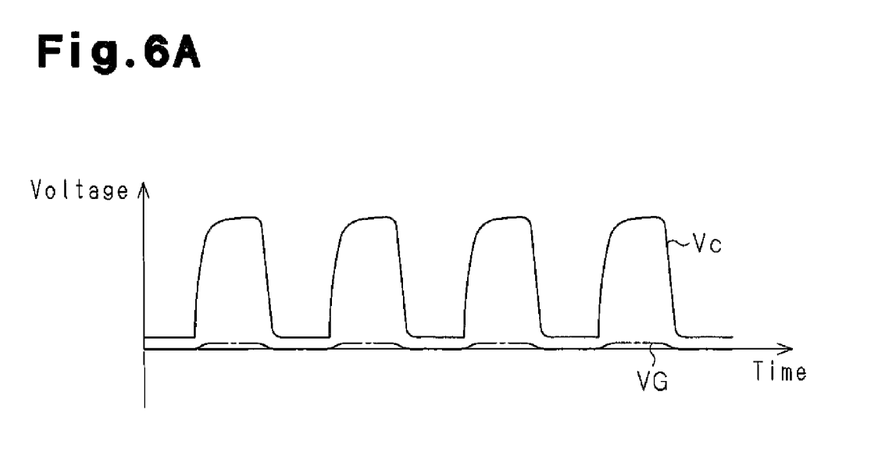
FIG. 6A is an operation waveform chart illustrating the input/output circuit of FIG. 5.

Therefore, as illustrated in FIG. 6A, the gate voltage VG of the transistor T1 fluctuates to the level slightly raised from the ground level when subjected to the influence of the parasitic capacitance of the transistor T1. This gate voltage VG is lower than the threshold value voltage of the transistor T1, and thus the transistor T1 maintains the stable inactivated state. As a result, the waveform of the voltage Vc of the transmission path 27 maintains a normal waveform, as illustrated in FIG. 6A.

Figure 6B:
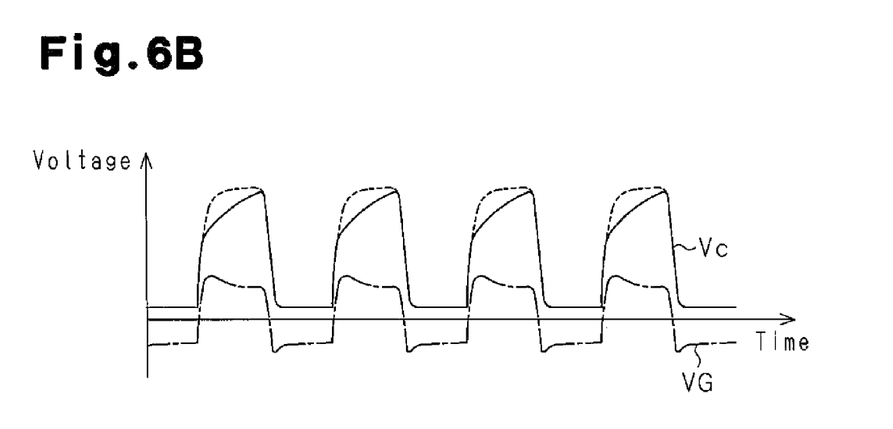
FIG. 6B is an operation waveform chart for comparison to the operation waveform chart of FIG. 6A.

FIG. 6B illustrates a waveform of when the waveform shaping capacitor C1 is coupled between the drain and the gate of the pull-down transistor T1 for comparison. In this case, as illustrated in FIG. 6B, the gate voltage VG of the transistor T1 greatly fluctuates when subjected to the influence of the AC-coupling by the waveform shaping capacitor C1 based on the change in state of the transmission path 27. Thus, the gate voltage VG of the transistor T1 may not be stably maintained at L level. As a result, the waveform of the signal, which is communicated between the other devices coupled to the transmission path 27, changes into a waveform illustrated by the solid line in FIG. 6B.

The output circuit of the present embodiment has the following advantages.

(1) The first transistor T1 is activated and inactivated in response to the signal S5. The transistor T1 that has been activated pulls down the potential level of the transmission path 27 coupled to the external terminal P2. The first end of the capacitor C1 that shapes the waveform of the signal in the transmission path 27 is coupled to the gate terminal of the first transistor T1. The second end of the capacitor C1 is coupled to the clamp circuit 46.

The clamp circuit 46 includes the transistor T15 and the resistor R25 coupled to the drain terminal of the transistor T15. For example, the transistor T15 may be formed similar to the first transistor T1. The second end of the capacitor C1 is coupled to the node ND between the drain terminal of the transistor T15 and the resistor R25.

The transistor T15 of the clamp circuit 46 is activated and inactivated similar to the pull-down transistor T1. Therefore, the potential of the node ND coupled to the second end of the capacitor C1 also changes similar to the change in state of the transmission path 27. The capacitor C1 AC-couples the node ND and the gate terminal of the transistor T15 and controls the slope of the rising waveform as well as the slope of the falling waveform of the gate voltage of the transistor T15. The capacitor C1 and the clamp circuit 46 may be included in the output waveform slope control circuit. The gate terminal of the transistor T15 is coupled to the gate terminal of the pull-down transistor T1. Thus, the slope of the gate voltage of the transistor T1 is controlled by the AC-coupling action of the capacitor C1. As a result, the slope of the fall of the signal at the external terminal P2 coupled to the transistor T1, that is, the fall-rate of the potential level of the transmission path 27 is controlled.

The waveform shaping capacitor C1 is not coupled between the gate terminal of the transistor T1, which pulls down the potential of the transmission path 27 coupled to the external terminal P2, and the external terminal P2. Therefore, when the high potential voltage VDE is not supplied to the device 22 (e.g., power supply is turned OFF), the gate voltage of the transistor T1 is maintained substantially at ground level even if the potential level of the transmission path 27 is changed by the operation of other devices. Thus, the signal waveform in the transmission path 27 is suppressed from undesirably changing due to the operation of the transistor T1.

It should be apparent to those skilled in the art that the aforementioned embodiments may be embodied in many other forms without departing from the spirit or scope of the invention. Particularly, it should be understood that the aforementioned embodiments may be embodied in the following forms.

The input/output circuit 34 may be formed as an output circuit omitting the function of the input circuit (resistor R31 and buffer circuit 51) from the circuit 34.

The transistors that form the input/output circuit 34 are not limited to the MOS transistors, and may be bipolar transistors.

The signal S3 is provided to the gate terminal of the transistor T16 of the clamp circuit 46. Instead, the gate of the transistor T16 may be coupled to the ground GND so as to pull up the potential of the node ND using an element having high resistance component, that is, to activate the transistor T16. Furthermore, the transistor T16 may be omitted, and the node ND may be pulled up to the high potential voltage VDE with the resistor R25.

In FIG. 4, the first high potential voltage VDI and the second high potential voltage VDE are illustrated, but the structure of the output circuit (input/output circuit) described above may be applied on the device in which a single voltage is supplied to the logic circuit 31 and the input/output circuits 33 and 34, that is, the device that operates by a single power supply voltage. In such a case, the shift circuit 32 is omitted.

The following is disclosed in relation to the aforementioned embodiments.

The output circuit may include a first transistor, a second transistor, a capacitor, a drive circuit, and a clamp circuit. The first transistor may be formed by an N-channel MOS transistor. The first transistor includes a drain terminal coupled to the external terminal and a gate terminal that receives a first drive signal, and drives a potential at the external terminal in accordance with the first drive signal. The capacitor includes a first end and a second end, which first end of the capacitor is coupled to the gate terminal of the first transistor. The second transistor may be formed by an N-channel MOS transistor. The second transistor includes a gate terminal coupled to the first end of the capacitor and a drain terminal coupled to the second end of the capacitor. The first transistor is coupled to the external terminal, but the second transistor is not coupled to the external terminal. The drive circuit generates the first drive signal that drives the first and second transistors. The clamp circuit (output waveform slope control circuit) clamps the second end of the capacitor to a potential corresponding to the operation of the first transistor.

All examples and conditional language recited herein are intended for pedagogical purposes to aid the reader in understanding the principles of the invention and the concepts contributed by the inventor to furthering the art, and are to be construed as being without limitation to such recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

The invention claimed is:

1. An output circuit comprising:
   a first transistor coupled to an external terminal and including a gate terminal that receives a first drive signal, wherein the first transistor drives a potential at the external terminal in accordance with the first drive signal;
   a capacitor including a first end and a second end, the first end being coupled to the gate terminal of the first transistor; and
   a clamp circuit that clamps the second end of the capacitor to a potential corresponding to the operation of the first transistor;
   wherein the first transistor includes a drain terminal that is not coupled to the capacitor but is coupled to the external terminal.

2. The output circuit according to claim 1, wherein the first transistor is an N-channel MOS transistor.

3. The output circuit according to claim 1, further comprising:
   a drive circuit that generates the first drive signal that drives the first transistor and the clamp circuit; and
   when the first transistor is activated by the first drive signal, the clamp circuit pulls down the second end of the capacitor to a low potential voltage level in response to the first drive signal.

4. The output circuit according to claim 1, wherein the clamp circuit and the capacitor serve as an output waveform slope control circuit, in which the clamp circuit controls a potential at the gate terminal of the first transistor in cooperation with the capacitor based on the first drive signal to adjust a slope of an output signal that is output to the external terminal.

5. The output circuit according to claim 1, wherein:
   the first transistor includes a source terminal that receives a low potential voltage and a drain terminal coupled to the external terminal; and
   the clamp circuit includes:
      a second transistor including a gate terminal coupled to the first end of the capacitor, a source terminal supplied with the low potential voltage, and a drain terminal coupled to the second end of the capacitor; and
      a resistor including a first end coupled to the drain terminal of the second transistor and a second end supplied with a high potential voltage.

6. An output circuit comprising:
   a first transistor coupled to an external terminal and including a gate terminal that receives a first drive signal, wherein the first transistor drives a potential at the external terminal in accordance with the first drive signal;
   a capacitor including a first end and a second end, the first end being coupled to the gate terminal of the first transistor; and
   a clamp circuit that clamps the second end of the capacitor to a potential corresponding to the operation of the first transistor, wherein the clamp circuit includes:
      a second transistor coupled to the second end of the capacitor and including a gate terminal that receives the first drive signal, the second transistor being the same conductivity type as the first transistor; and
      a resistor that pulls up a potential at a coupling node that couples the second transistor and the capacitor.

7. The output circuit according to claim 6, wherein the clamp circuit further includes a third transistor coupled in series with the resistor, the third transistor being a different conductivity type from the first transistor,
  wherein the third transistor is driven by a second drive signal in phase with the first drive signal that drives the second transistor.

8. The output circuit according to claim 6, wherein:
  the second transistor includes a drain terminal that is not coupled to the external terminal but is coupled to the second end of the capacitor; and
  the gate terminal of the second transistor is coupled to the first end of the capacitor.

9. The output circuit according to claim 6, wherein the first transistor and the second transistor are N-channel MOS transistors.

10. A system comprising:
  a plurality of devices that communicate with each other through a transmission path coupled to an external terminal, each of the plurality of devices including an output circuit, the output circuit including;
    a transistor coupled to the external terminal and including a gate terminal that receives a first drive signal, wherein the transistor drives a potential at the external terminal in accordance with the first drive signal;
    a capacitor including a first end and a second end, the first end being coupled to the gate terminal of the transistor, and
    a clamp circuit that clamps the second end of the capacitor to a potential corresponding to the operation of the transistor,
    wherein the transistor includes a drain terminal that is not coupled to the capacitor but is coupled to the external terminal.

11. A method of controlling an output circuit, the output circuit including a transistor and a capacitor, the transistor being coupled to an external terminal and including a gate terminal that receives a first drive signal, and the capacitor including a first end coupled to the gate terminal of the transistor and a second end, the method comprising:
  driving a potential at the external terminal by the transistor in accordance with the first drive signal, wherein the transistor includes a drain terminal that is not coupled to the capacitor but is coupled to the external terminal; and
  clamping the second end of the capacitor to a potential corresponding to the operation of the transistor.

* * * * *